(12) United States Patent
You et al.

(10) Patent No.: US 10,030,858 B2
(45) Date of Patent: Jul. 24, 2018

(54) LED LIGHTING DEVICE AND SYSTEM, AND RESET BUTTON ARRANGEMENT METHOD

(71) Applicant: SENGLED OPTOELECTRONICS CO., LTD., Tongxiang (CN)

(72) Inventors: Bo You, Tongxiang (CN); Jinxiang Shen, Tongxiang (CN)

(73) Assignee: SENGLED OPTOELECTRONICS CO., LTD., Tongxiang (CN)

( * ) Notice: Subject to any disclaimer, the term of this patent is extended or adjusted under 35 U.S.C. 154(b) by 128 days.

(21) Appl. No.: 15/108,800

(22) PCT Filed: Dec. 25, 2015

(86) PCT No.: PCT/CN2015/099054
§ 371 (c)(1),
(2) Date: Jun. 29, 2016

(87) PCT Pub. No.: WO2016/101922
PCT Pub. Date: Jun. 30, 2016

(65) Prior Publication Data
US 2016/0320039 A1    Nov. 3, 2016

(30) Foreign Application Priority Data
Dec. 26, 2014    (CN) .......................... 2014 1 0833708

(51) Int. Cl.
*F21V 29/00*    (2015.01)
*F21V 23/04*    (2006.01)
(Continued)

(52) U.S. Cl.
CPC .......... *F21V 23/0435* (2013.01); *F21K 9/232* (2016.08); *F21K 9/235* (2016.08);
(Continued)

(58) Field of Classification Search
CPC .... F21V 23/0435; F21V 23/003; F21V 23/04; F21V 29/74; F21V 23/004; F21V 29/503;
(Continued)

(56) References Cited

U.S. PATENT DOCUMENTS 8,498,111 B2 *    7/2013    Wang et al. .......... G06F 1/1613
                                                    362/85
2006/0072331 A1 *    4/2006    Yamaguchi et al. ..... B62J 35/00
                                                    362/473
(Continued)

FOREIGN PATENT DOCUMENTS

CN    203810121 U    9/2014
CN    203980178 U    12/2014
(Continued)

OTHER PUBLICATIONS

The World Intellectual Property Organization (WIPO) International Search Report for PCT/CN2015/099054 dated Mar. 31, 2016.

*Primary Examiner* — Y M. Lee
(74) *Attorney, Agent, or Firm* — Anova Law Group, PLLC

(57) ABSTRACT

A light emitting diode (LED) lighting device is provided. The device includes a lamp shell which is a heat sink including a heat sink covering and a heat sink body and an LED light source assembly installed on top of the heat sink body. The device also includes a control module configured to control the LED light source assembly and an LED driving and power supply unit configured to drive the LED light source assembly and provide electrical power for the LED lighting device. Further, the device includes a reset button electrically connected to the control module, wherein the reset button is set inside the lamp shell and a control push-button of the reset button is set at the sidewall of the lamp shell.

11 Claims, 4 Drawing Sheets

(51) Int. Cl.
*F21K 9/232* (2016.01)
*F21V 29/503* (2015.01)
*F21V 29/74* (2015.01)
*F21K 9/235* (2016.01)
*F21V 23/00* (2015.01)
*H01L 33/48* (2010.01)
*H01L 33/64* (2010.01)
*F21K 9/238* (2016.01)
*F21V 25/00* (2006.01)
*F21Y 105/10* (2016.01)
*F21Y 115/10* (2016.01)

(52) U.S. Cl.
CPC ............ *F21K 9/238* (2016.08); *F21V 23/003* (2013.01); *F21V 23/004* (2013.01); *F21V 23/04* (2013.01); *F21V 23/045* (2013.01); *F21V 29/503* (2015.01); *F21V 29/74* (2015.01); *H01L 33/486* (2013.01); *H01L 33/644* (2013.01); *F21V 25/00* (2013.01); *F21Y 2105/10* (2016.08); *F21Y 2115/10* (2016.08)

(58) Field of Classification Search
CPC ........ F21V 23/045; F21V 25/00; F21K 9/238; F21K 9/235; F21K 9/232; H01L 33/486; H01L 33/644; F21Y 2105/10; F21Y 2115/10

See application file for complete search history.

(56) References Cited

U.S. PATENT DOCUMENTS

| | | | |
|---|---|---|---|
| 2013/0051079 A1* | 2/2013 | Xu | F21S 6/001 362/640 |
| 2015/0103515 A1* | 4/2015 | Bosua et al. | F21V 29/83 362/373 |
| 2015/0109781 A1* | 4/2015 | Van Der Merwe | F21V 23/0435 362/249.01 |

FOREIGN PATENT DOCUMENTS

| | | |
|---|---|---|
| CN | 104566027 A | 4/2015 |
| CN | 104566029 A | 4/2015 |
| CN | 103912810 A | 5/2015 |
| CN | 204328571 U | 5/2015 |
| CN | 204328580 U | 5/2015 |
| JP | H10261314 A | 9/1998 |
| KR | 20140064491 A | 5/2014 |

* cited by examiner

LED LIGHTING DEVICE AND SYSTEM, AND RESET BUTTON ARRANGEMENT METHOD

CROSS-REFERENCES TO RELATED APPLICATIONS

This PCT patent application is a national phase entry under 35 U.S.C. § 371 of International Application No. PCT/CN2015/099054, filed on Dec. 25, 2015, which claims priority to Chinese Patent Application No. 201410833708.5, filed on Dec. 26, 2014, the entire contents of which are incorporated herein by reference.

FIELD OF THE INVENTION

The present disclosure generally relates to light emitting diode (LED) lighting technology and, more particularly, relates to LED lighting devices and systems, and related reset button arrangements.

BACKGROUND

Light emitting diode (LED) is a solid state semiconductor device that can convert electrical energy into visible light. The LED can directly convert electricity into light. LED lighting may generally provide advantages in energy conservation, environmental protection, controllable lighting, solid state lighting, and long operational lifetime. LED lamps thus have been widely used in various areas for public, commercial, and/or indoor lighting in a low carbon life style.

With the development of intelligent technology and network technology, LED lighting devices also become increasingly intelligent. With its unique power and control mode, the LED lighting device may easily integrate with intelligent control and multimedia functions. In a smart home, an LED lighting device may be connected to various intelligent terminal devices in a home environment or a public environment through network technologies, achieving a centralized lighting control through an internal control chip inside the LED lighting device. Therefore, the user may enjoy a smart environment experience and a comfortable living environment.

However, when an LED lighting device with a control function is used, sometimes the LED lighting device needs to be reset. For example, when performance of the LED lighting device is unstable, or the LED lighting device is down, or password of the LED lighting device is forgotten, or factory parameters need to be reset, the LED lighting device needs to be restarted. If a reset button is not installed, when the LED lighting device has problems or one of the above situations occur, the LED lighting device needs to be sent back to the manufacturer for repair or replacement, resulting in waste of resources and inconvenience. Some existing LED lighting devices have installed reset buttons. One way is to install the reset button inside the LED lighting device, e.g., to install the reset button on a light panel. The reset button can be controlled only when a lampshade is removed. The other way is to install the reset button inside the LED lighting device and open a through hole on a lamp shell. The reset button can be pressed by using a needle to insert into the through hole. However, because operations for the reset button need to be performed at a state when the LED lighting device is powered on, and the LED lighting device is often installed on a wall or on top of a wall, the operations are often hard to perform. Sometimes, due to a special structure of the installation location, the reset button may not be easily reachable, resulting in failure or difficulty in using the reset function.

The disclosed LED lighting devices and systems, and reset button arrangement methods are directed to solve one or more problems set forth above and other problems.

BRIEF SUMMARY OF THE DISCLOSURE

One aspect of the present disclosure includes a light emitting diode (LED) lighting device. The device includes a lamp shell which is a heat sink including a heat sink covering and a heat sink body and an LED light source assembly installed on top of the heat sink body. The device also includes a control module configured to control the LED light source assembly and an LED driving and power supply unit configured to drive the LED light source assembly and provide electrical power for the LED lighting device. Further, the device includes a reset button electrically connected to the control module, where the reset button is set inside the lamp shell and a control push-button of the reset button is set at the sidewall of the lamp shell.

Another aspect of the present disclosure includes a light emitting diode (LED) lighting system. The system includes at least one LED lighting device. The device includes a lamp shell which is a heat sink including a heat sink covering and a heat sink body and an LED light source assembly installed on top of the heat sink body. The device also includes a control module configured to control the LED light source assembly and an LED driving and power supply unit configured to drive the LED light source assembly and provide electrical power for the LED lighting device. Further, the device includes a reset button electrically connected to the control module, where the reset button is set inside the lamp shell and a control push-button of the reset button is set at the sidewall of the lamp shell. The system also includes a plurality of smart terminals with a wireless function wirelessly connected to the at least one LED lighting device through a wireless module.

Another aspect of the present disclosure includes a method for arranging a reset button of a light emitting diode (LED) lighting device. The method includes arranging the reset button which is electrically connected to a control module in a lamp shell. The method also includes arranging a control push-button of the reset button on the sidewall of the lamp shell.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
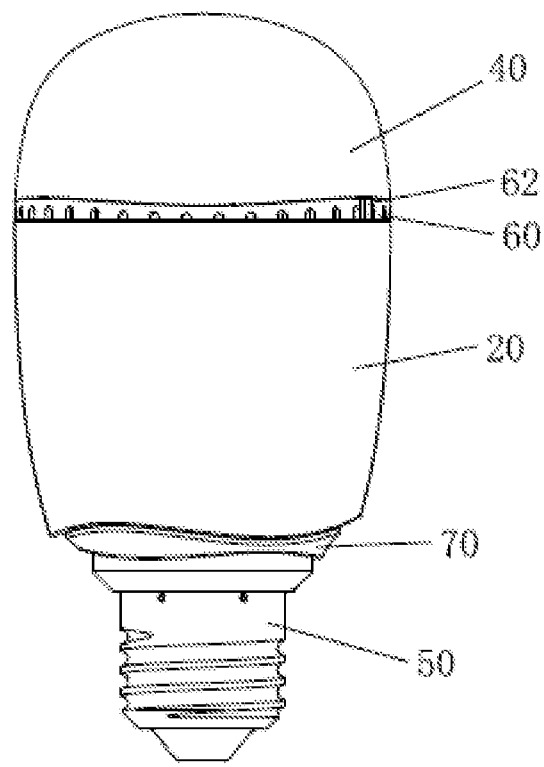
FIG. 1 illustrates a structure diagram of an exemplary LED lighting device consistent with the disclosed embodiments.
Figure 2:
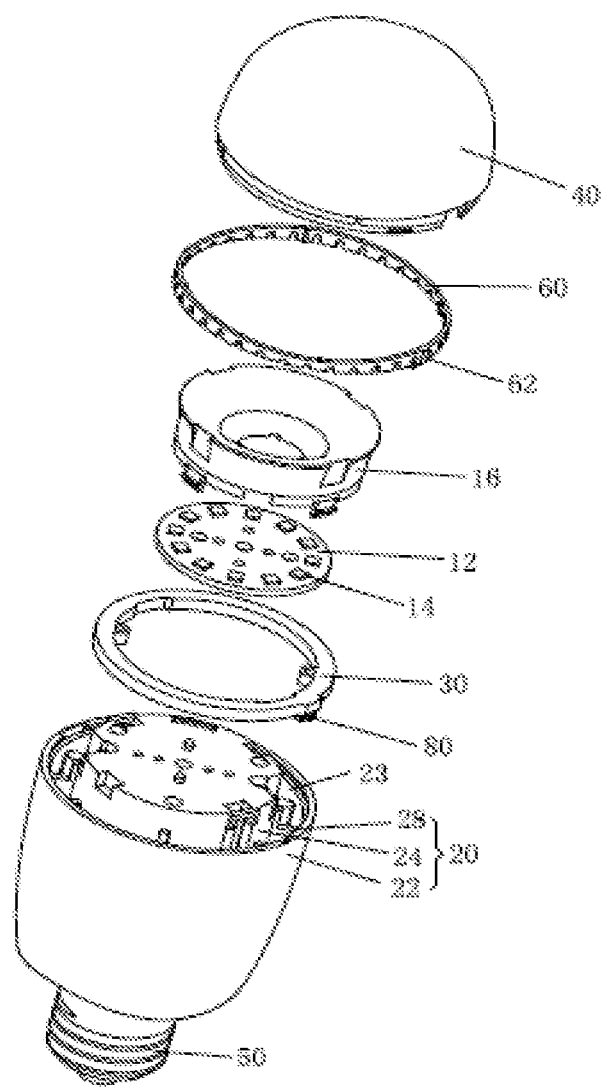
FIG. 2 illustrates a blow-out diagram of an exemplary LED lighting device consistent with the disclosed embodiments.

FIG. 1 illustrates a structure diagram of an exemplary LED lighting device consistent with the disclosed embodiments. FIG. 2 illustrates a blow-out diagram of an exemplary LED lighting device consistent with the disclosed embodiments. As shown in FIG. 1 and FIG. 2, the LED lighting device may include a lampshade 40, an LED driving and power supply unit, an LED light source assembly, a lamp shell 20, a control module, a wireless module, a RF antenna 30, a reset button 80, a enhancer 60, a plastic seat 70, and a lighting base 50. The lighting base 50 may be configured to electrically connect the LED lighting device to an external lighting holder. The plastic seat 70 is sleeved inside the lamp shell 20 and is located between the lamp shell 20 and the lighting base 50. The plastic seat 70 has a hollow structure containing the LED driving and power supply unit, the control module, and the wireless module.

The LED driving and power supply unit is electrically connected to the lighting base 50 and the control module. The LED driving and power supply unit may be configured to drive the LED light source assembly and provide electrical power for the whole LED lighting device. The control module is electrically connected to the reset button 80 and the wireless module. The wireless module has a wireless router function. The reset button 80 may be configured to reset the control module or the wireless module.

The lamp shell 20 is a heat sink including a heat sink covering 22 which has an opening 23 and a heat sink body 24 protruding outwardly from the opening 23 along a central axis of the heat sink covering 22. The heat sink body 24 is set inside the heat sink covering 22. Optionally, a cross section of the LED lighting device is a round-shaped section, and a cross section corresponding to the heat sink covering 22 and the heat sink body 24 is a round-shaped section. A plurality of cooling fins 28 are circumferentially distributed along upper edge of periphery of the heat sink body 24. The plurality of cooling fins 28 extend to and connect to the heat sink body 24 along the inner wall of the heat sink covering 22, such that a certain space between the heat sink body 24 and the heat sink covering 22 is formed, thus having an improved cooling effect. The heat sink body 24, the heat sink covering 22 and the cooling fins 28 may be integrated into one piece or may be separate pieces. Optionally, the heat sink 20 uses aluminum material. It should be understood that the lamp shell 20 may use different thermal conductivity materials (e.g., conductive plastic) to form the heat sink covering 22 and the heat sink body 24, respectively. The LED light source assembly may include an LED plate 12 installed on the top of the heat sink body 24, a lens 16 installed on the LED plate 12 and at least one LED light source 14 installed on the LED plate 12. The lens 16 has visible light transmittance and covers the LED light source 14. The lampshade 40 covers the LED light source assembly and is clamped with the heat sink covering 22. The enhancer 60 is sleeved between the lampshade 40 and the lamp shell 20. Specifically, a control push-button of the reset button 80 is set on the enhancer 60.

The RF antenna 30 is sleeved on the top of the periphery of the heat sink body 24 and a certain space exists between the RF antenna 30 and the inner wall of the heat sink covering 22. A plane including the highest point of the RF antenna 30 parallels to or is lower than a plane including the highest point of the top of the heat sink body 24. The plane including the highest point of the RF antenna 30 is coplanar to or is higher than a plane including the opening 23 of the heat sink covering 22. Therefore, the RF antenna 30 can receive and send RF signals without affecting the lighting path of the LED lighting source 14.

Figure 3:
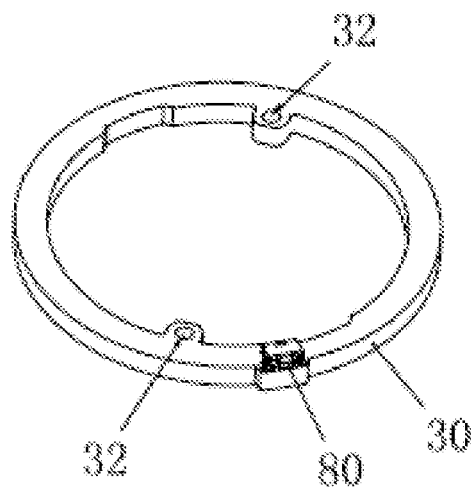
FIG. 3 illustrates a structure diagram of an exemplary radio frequency (RF) antenna and a reset button in the LED lighting device consistent with the disclosed embodiments.

FIG. 3 illustrates a structure diagram of an exemplary radio frequency (RF) antenna and a reset button in the LED lighting device shown in FIG. 1 consistent with the disclosed embodiments. As shown in FIG. 3, the RF antenna 30 is a round-shaped antenna. The RF antenna is sleeved on the top of the periphery of the heat sink body 24. It should be understood that the RF antenna may also be an arc-shaped antenna, or the RF antenna may be designed to another shape based on specific structure contour of the heat sink body 24 and the heat sink covering 22. The RF antenna 30 is installed and fixed on the peripheral of the heat sink body 24 through a screw and a mounting platform 32 having a screw hole on the RF antenna. In order to achieve a desired effect, a notch is set in the inner wall of the RF antenna, and a corresponding protruding portion is set at the periphery of the heat sink body 24. The notch of the RF antenna 30 is clamped with the protruding portion of the heat sink body 24. The reset button is welded on the RF antenna 30. Optionally, the RF antenna may be a two-sided printed circuit plate (PCB). The thickness of the PCB may be 2 to 4 mm. Optionally, the thickness of the PCB may be 3 mm. One side of the PCB is integrated with radio frequency circuits of the RF antenna 30. The welding circuit (e.g., welding spot) of the reset button is set on the other side of the PCB.

Figure 4:
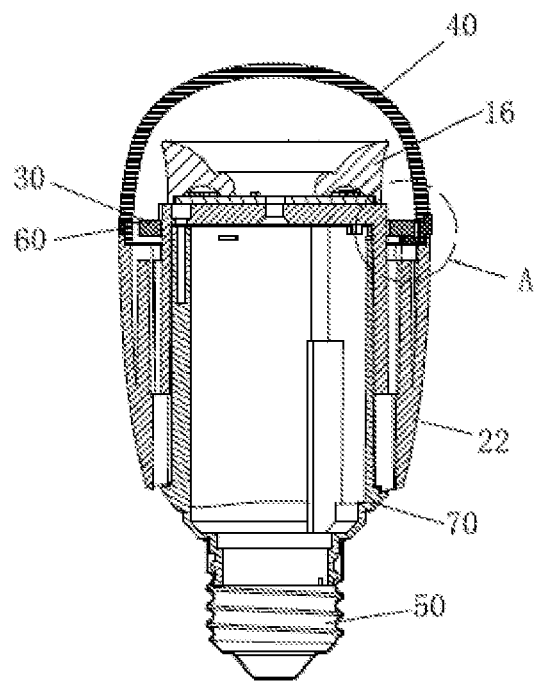
FIG. 4 illustrates a cross-sectional view of the LED lighting device consistent with the disclosed embodiments.
Figure 5:
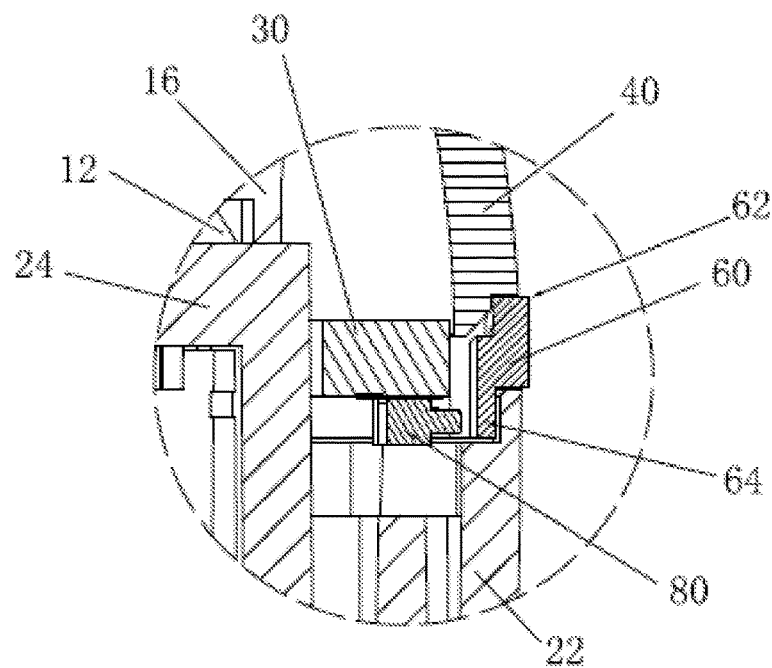
FIG. 5 illustrates an enlarged schematic diagram of part A in a cross-sectional view of the LED lighting device consistent with the disclosed embodiments.

FIG. 4 illustrates a cross-sectional view of the LED lighting device shown in FIG. 1 consistent with the disclosed embodiments. FIG. 5 illustrates an enlarged diagram of part A shown in FIG. 4 consistent with the disclosed embodiments. As shown in FIG. 4 and FIG. 5, the arrangement of the reset button is described as follows. The reset button 80 which is electrically connected to the control module is set inside the lamp shell 20. A control push-button of the reset button 80 is set on the side wall of the lamp shell 20. Optionally, the control push-button of the reset button 80 is welded on the RF antenna 30. The enhancer 60 is set along the opening of the heat sink covering 22. The control push-button of the reset button 80 may be set on the enhancer 60. It should be understood that a through-hole may be opened at a position corresponding to the reset button 80 at the sidewall of the lamp shell 20. The control push-button protrudes from the through-hole. Or, a soft key is set in the through-hole to form the control push-button. In this embodiment, the control push-button is set on the enhancer 60. Further, the control push-button may be hidden and would not affect the appearance of the LED lighting device. In addition, the structure of the LED lighting device may be more compact and reasonable, thus saving manufacturing cost. The lampshade 40 is connected with the heat sink covering 22. The enhancer 60 is sleeved between the lampshade 40 and the heat sink covering 22. The connection portion of the lampshade 40 and heat sink covering 22 may have a notch, such that the control push-button on the enhancer 60 can be in contact with the reset button 80. Specifically, the control push-button may be a bump 62 on the enhancer 60. The reset operation can be controlled through pressing the bump 62. The enhancer 60 may be a plastic part with certain elasticity, or may be made of other materials with elasticity. When the bump 62 is pressed, the bump 62 extends to and compresses the reset button 80 in the lamp shell 20. After the bump 62 makes contact with the reset button 80, the pressure on the bump 62 is transmitted to the reset button 80, such that the reset button 80 is controlled. The reset button 80 is fixed on the RF antenna 30. In one embodiment, the position of the reset button 80 is directly inside the location of the bump 62 on the enhancer 60, the reset button 80 can be triggered when the bump 62 is pressed. In another embodiment, the position of the reset button 80 is not directly inside the location of the bump 62 on the enhancer 60, the bump 62 may extend to the position of reset button 80 to form a presser 64. In this disclosure, a plane including the highest point of the RF antenna is lower than a plane including the highest point of the heat sink body 24, but is higher than a plane including the opening 23 of the heat sink covering 22. Therefore, the bump 62 extends downward to form the presser 64. When the bump 62 is pressed, the bump 62 moves toward the position of the reset button 80 and the presser 64 makes contact with the reset button 80. The pressing effect of the bump 62 is transmitted to the reset button 80, thus controlling the reset button 80. The reset button 80 may be welded on the PCB of the RF antenna. The RF antenna 30 and the reset button 80 are integrated together, thus saving the space and making the structure of the LED lighting device more compact.

The hollow structure of the plastic seat 70 of the LED lighting device may also contain other components of the LED lighting device, such as one or more sensors for monitoring the operation status or the environmental conditions of the LED lighting device. In one embodiment, the hollow structure may contain one or more sensors and a display unit. The display unit may include a digital display panel and/or an indicator light. The display unit may be visible from outside the lamp shell 20, such as through a cut-through window on the lamp shell 20 for the display unit. The display unit may display, for example, the environmental information collected by the one or more sensors (e.g., temperature, humidity, air quality). The display unit may display, for example, the status of the wireless connection, i.e., whether the LED lighting device is properly connected to the internet through the wireless module. If the LED lighting device is not properly connected to the internet, the display unit may display a message or an image, prompting a user to reset the wireless module by pressing the control push-button. Once the user presses the control push-button (e.g., bump 62), the display unit may show the status of the wireless connection, such as the wireless module is turned off, turned on, making a connection, sending or receiving data, etc. In some embodiments, the display unit may be programmed to display various information collected by the sensors on a schedule (e.g., 10 seconds for environmental data, 10 seconds for operational data, etc.).

In one embodiment, a pressure sensor may be placed on the surface on which the control push-button 60 applies pressure onto reset button 80. The display unit may present information read from the sensor. When a user presses control push-button 60, the display unit may show that the wireless module is being reset or rebooted. If a user presses the control push-button 60 and the display unit does not show the reset process, the user may conclude that the reset button 80 or the control push-button 60 is broken.

Figure 6:
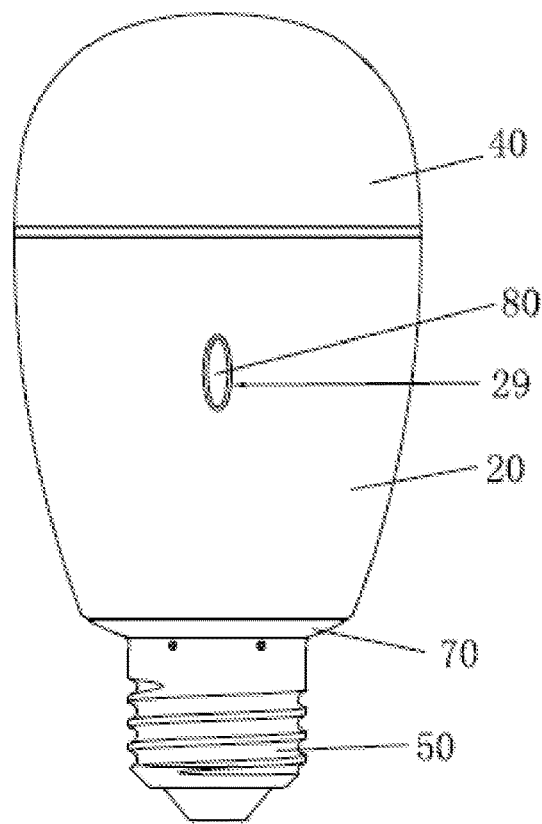
FIG. 6 illustrates a structure schematic diagram of another exemplary LED lighting device consistent with the disclosed embodiments.

FIG. 6 illustrates a structure diagram of another exemplary LED lighting device consistent with the disclosed embodiments. As shown in FIG. 6, the LED lighting device may include a lamp shell 20, a lighting base 50, a plastic seat 70 and a lampshade 40. The lampshade 40 is connected to the lamp shell 20 and the lampshade 40 covers the LED light source assembly. The plastic seat 70 is sleeved inside the lamp shell 20 and is located between the lamp shell 20 and the lighting base 50. The plastic seat 70 has a hollow structure containing circuit modules, such as a control module and an LED driving and power supply unit. The reset circuit of the reset button 80 is set inside the lamp shell 20. Different from the above embodiments, a through-hole 29 is set in the middle of the sidewall of the lamp shell 20. A control push-button of the reset button 80 is set in the through-hole 29 on the lamp shell 20 and protrudes outwardly from the surface of the lamp shell 20. The shape of the reset button 80 and the corresponding through-hole 29 can be set in a round shape, rectangle shape or other shapes.

Accordingly, an LED intelligent lighting system is provided in this disclosure. In one embodiment, the LED intelligent lighting system may include at least one LED lighting device and a plurality of smart terminals with wireless functions. The smart terminal may be a laptop, a tablet computer, a smart phone, a smart watch, and a personal computer. The LED lighting device may include a wireless module having a wireless router function. The plurality of smart terminals are wirelessly connected to the LED lighting device through the wireless module, respectively. When the LED lighting device is connected to the Internet through the wireless module, the plurality of smart terminals can be connected to the Internet through the LED lighting device, thus implementing wireless Internet access functions. When the password of the wireless router of the LED lighting device is forgotten, and the LED lighting device needs to be restarted or needs to be reset back to factory settings, the reset operation can be performed through pressing the bump 62 on the sidewall of the lamp shell 20 to control the reset button 80. The reset operation is very simple and convenient to initiate.

The embodiments disclosed herein are exemplary only. Other applications, advantages, alternations, modifications, or equivalents to the disclosed embodiments are obvious to those skilled in the art and are intended to be encompassed within the scope of the present disclosure.

INDUSTRIAL APPLICABILITY AND ADVANTAGEOUS EFFECTS

Without limiting the scope of any claim and/or the specification, examples of industrial applicability and certain advantageous effects of the disclosed embodiments are listed for illustrative purposes. Various alternations, modifications, or equivalents to the technical solutions of the disclosed embodiments can be obvious to those skilled in the art and can be included in this disclosure.

Comparing with the existing technology, a reset button is fixed in the lamp shell of the LED lighting device, and the control push-button of the reset button is set on the sidewall of the lamp shell. When the reset operation needs to be performed, the reset button can be controlled by pressing the control push-button on the lamp shell, thus implementing a reset or restart operation for the LED lighting device. The control push-button can be flush mounted or incorporated with other components of the lighting device. Thus, the reset button does not affect the appearance of the LED lighting device. The arrangement is reasonable and the operation is easy. At the same time, although the control push-button is set on the sidewall of the lamp shell, because the reset button of the LED lighting device can only work under a power-on state, the LED lighting device is always installed on the wall and the reset button can only be triggered when the control push-button is pressed, an accidental operation of the reset button can be avoided. This makes the reset process safe and reliable.

REFERENCE SIGN LIST

Light emitting diode (LED) plate 12
LED light source 14
Lens 16
Lamp shell 20
Heat sink covering 22
Opening of heat sink covering 23
Heat sink body 24
Through-hole 29
Radio frequency (RF) antenna 30
Mounting platform 32
Lampshade 40
Lighting base 50
Enhancer 60
Bump 62
Plastic seat 70
Reset button 80

What is claimed is:
1. A light emitting diode (LED) lighting device, comprising:
 a lamp shell including a heat sink covering and a heat sink body, the lamp shell having an opening;
 an LED light source assembly installed on a top surface of the heat sink body, the LED light source assembly being located at a central of the opening of the lamp shell and protruding outwardly from the opening along a central axis of the lamp shell;
 a control module configured to control the LED light source assembly;
 an LED driving and power supply unit configured to drive the LED light source assembly and provide electrical power for the LED lighting device;
 a reset button electrically connected to the control module and arranged inside the lamp shell;
 a control push-button of the reset button;
 a lampshade connected with the lamp shell to cover the opening of the lamp shell; and
 an enhancer being of a ring shape, located between the lampshade and the lamp shell and arranged along the opening of the lamp shell,
 wherein the control push-button of the reset button is placed on the enhancer, and a notch is arranged at a clamp portion of the lampshade such that the control push-button is aligned with the reset button and contacts the reset button.
2. The LED lighting device according to claim 1, wherein:
 the control push-button is a bump on the enhancer; and
 the reset button is controlled through pressing the control push-button.
3. The LED lighting device according to claim 2, wherein:
 the position of the control push-button on the enhancer and the position of the reset button are staggered; and
 a back of the control push-button on the enhancer extends towards the reset button and forms a presser which is used to control the reset button.

4. The LED lighting device according to claim 1, wherein:
 the lamp shell is a heat sink constituted of the heat sink covering, the heat sink body, and a plurality of cooling fins;
 the heat sink body is set inside the heat sink covering;
 the plurality of cooling fins are set between the heat sink body and the heat sink covering;
 the plurality of cooling fins extend from an inner wall of the heat sink covering to the heat sink body;
 the heat sink body protrudes outwardly from the heat sink covering along a central axis of the heat sink covering;
 the LED light source assembly is installed on the top surface of the heat sink body; and
 the reset button is set at peripheral of the heat sink body.
5. The LED lighting device according to claim 4, wherein:
 the heat sink covering, the heat sink body, and the plurality of cooling fins are integrated into one piece.
6. The LED lighting device according to claim 5, further including:
 a wireless module having a wireless router function, wherein:
  the wireless module is reset by the reset button; and
  the wireless module is electrically connected to the control module and the reset button, respectively.
7. The LED lighting device according to claim 6, wherein:
 the wireless module includes a radio frequency (RF) antenna,
 the RF antenna being electrically connected to the wireless module;
 the RF antenna being fixed inside the lamp shell; and
 the reset button being welded on the RF antenna.
8. The LED lighting device according to claim 7, wherein:
 the RF antenna is a round-shaped two-sided printed circuit plate (PCB);
 one side of the PCB is integrated with a radio-frequency circuit of the RF antenna; and
 the other side of the PCB is integrated with a welding circuit of the reset button.
9. A light emitting diode (LED) lighting system, comprising:
 at least one LED lighting device with a wireless module, including:
  a lamp shell including a heat sink covering and a heat sink body, the lamp shell having an opening;
  an LED light source assembly installed on a top surface of the heat sink body, the LED light source assembly being located at a central of the opening of the lamp shell and protruding outwardly from the opening along a central axis of the lamp shell;
  an LED driving and power supply unit configured to drive the LED light source assembly and provide electrical power for the LED lighting device;
  a control module configured to control the LED light source assembly;
  a reset button electrically connected to the control module, wherein:
   the reset button is set inside the lamp shell; and
   a control push-button of the reset button is set at a sidewall of the lamp shell;
  a lampshade connected with the lamp shell to cover the opening of the lamp shell; and
  an enhancer being of a ring shape, located between the lampshade and the lamp shell and arranged along the opening of the lamp shell, wherein the control push-button of the reset button is placed on the enhancer, and a notch is arranged at a clamp portion of the lampshade such that the control push-button is aligned with the reset button and contacts the reset button; and a plurality of terminal devices with a wireless function wirelessly connected to the at least one LED lighting device through the wireless module.

10. The LED lighting system according to claim 9, wherein:

the at least one LED lighting device is connected to the Internet through the wireless module; and the plurality of terminal devices are wirelessly connected to the Internet through the at least one LED lighting device.

11. A method for placing a reset button of a light emitting diode (LED) lighting device that includes a lamp shell having an opening, a lampshade connected with the lamp shell to cover the opening of the lamp shell, and an enhancer being of a ring shape, located between the lampshade and the lamp shell and arranged along the opening of the lamp shell, the method comprising:

placing the reset button, which is electrically connected to a control module of the LED lighting device configured to control the LED lighting device, inside the lamp shell;

placing a control push-button for pressing the reset button on the enhancer; and arranging a notch at a clamp portion of the lampshade such that the control push-button is aligned with the reset button and contacts the reset button.

* * * * *